United States Patent [19]

Laugesen et al.

[11] 4,063,117

[45] Dec. 13, 1977

[54] CIRCUIT FOR INCREASING THE OUTPUT CURRENT IN MOS TRANSISTORS

[75] Inventors: Ronald C. Laugesen, Sunnyvale; Ury Priel, Cupertino, both of Calif.

[73] Assignee: National Semiconductor Corporation, Santa Clara, Calif.

[21] Appl. No.: 757,710

[22] Filed: Jan. 7, 1977

[51] Int. Cl.² ..................... H03K 17/12; H03K 17/04; H03K 17/28; H03K 17/60
[52] U.S. Cl. .................................. 307/270; 307/205; 307/251; 307/DIG. 4
[58] Field of Search ............... 307/205, 208, 209, 214, 307/215, 270, 251, 246, DIG. 4, 293

[56] References Cited

U.S. PATENT DOCUMENTS

| | | | |
|---|---|---|---|
| 3,631,267 | 12/1971 | Heimbigner | 307/270 |
| 3,646,369 | 2/1972 | Fujimoto | 307/270 |
| 3,714,466 | 1/1973 | Spence | 307/251 X |
| 3,769,528 | 10/1973 | Chu et al. | 307/270 |
| 3,778,784 | 12/1973 | Karp et al. | 307/279 X |
| 3,806,880 | 4/1974 | Spence | 307/205 X |
| 3,898,479 | 8/1975 | Proebsting | 307/205 |

OTHER PUBLICATIONS

Anderson, "FET Inverter and Driver Circuit", *IBM Tech. Discl. Bull.*, vol. 16, No. 1, pp. 50–51; June 1973.

*Primary Examiner*—John S. Heyman
*Assistant Examiner*—Larry N. Anagnos
*Attorney, Agent, or Firm*—Gail W. Woodward; Willis E. Higgins

[57] ABSTRACT

In order to increase the output current of an MOS transistor, its gate is provided with a switched capacitor drive. A tri-state inverter is used to drive the output transistor gate from an input source. A pair of delay elements are cascaded to drive one input of a NOR gate, the other input of which is fed an undelayed signal. The NOR gate is used to switch a capacitor that is also coupled to the output transistor gate. The juncture between the delays is coupled to the control electrode of the tri-state inverter. During the first delay interval, the capacitor and the output transistor gate electrode are charged. Then after the second delay interval, which is shorter than the first, the capacitor is discharged into the output transistor gate electrode which is thereby driven substantially in excess of the conventional drive level.

5 Claims, 3 Drawing Figures

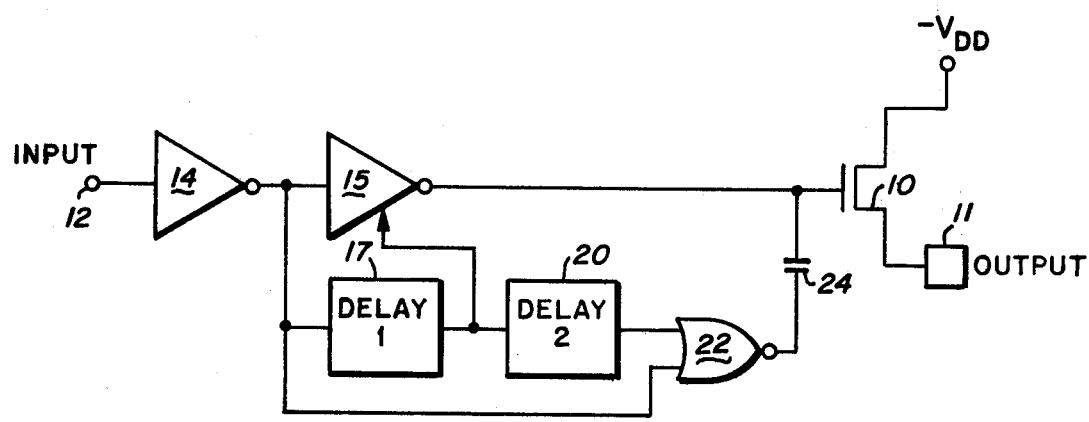
Fig_1
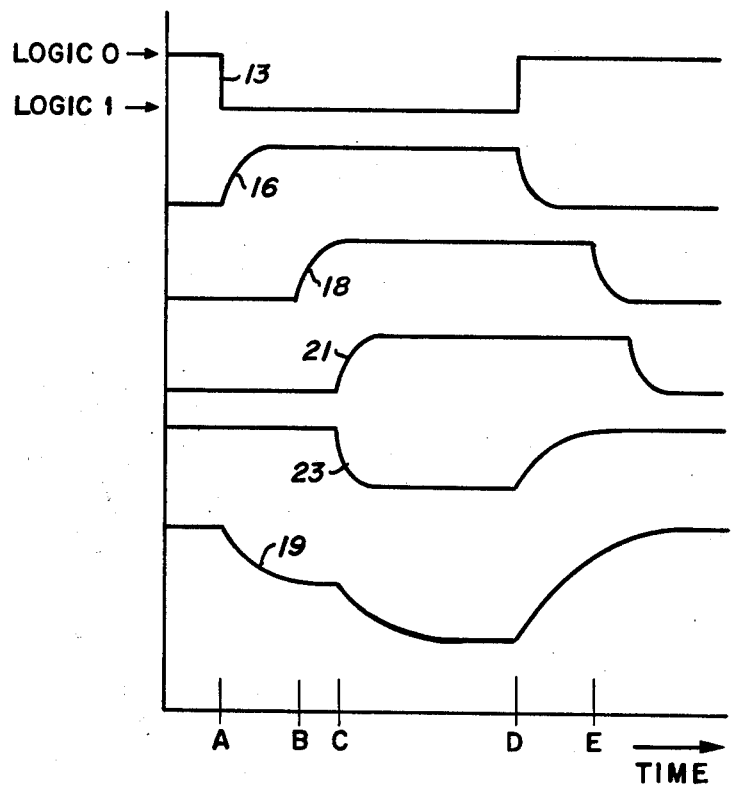
Fig_2

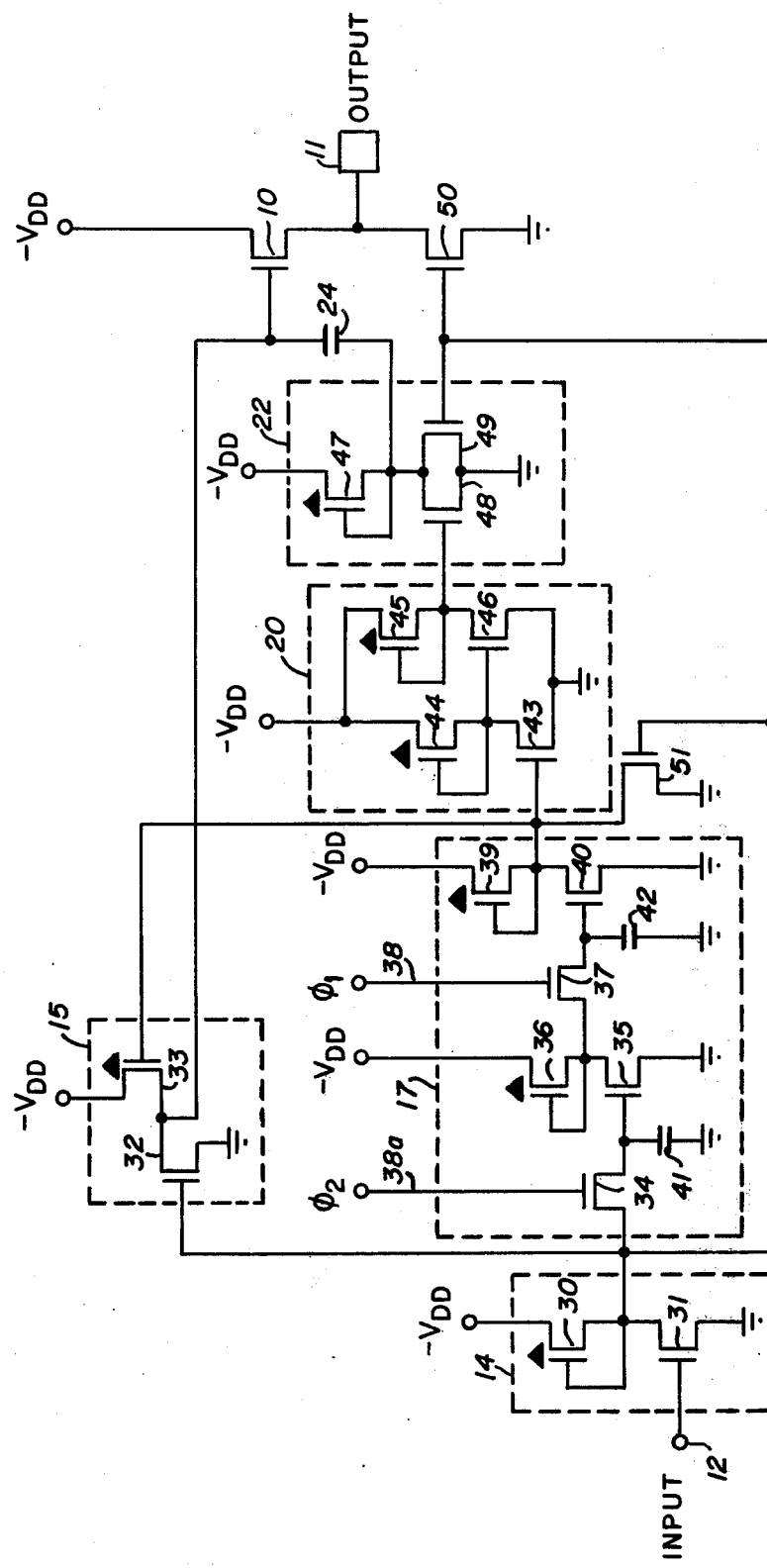
Fig_3

CIRCUIT FOR INCREASING THE OUTPUT CURRENT IN MOS TRANSISTORS

BACKGROUND OF THE INVENTION

In battery operated equipment it is desirable to operate at low voltages. When metal oxide semiconductor (MOS) transistors are operated at low voltage, it is difficult to achieve large output currents using devices of reasonable area. Numerous ways have been developed to increase the output current, but many problems have arisen in implementing them. In most cases, only slight current improvements are noted. In other approaches overshoot problems develop and these result in undesirable performance.

SUMMARY OF THE INVENTION

It is the object of the invention to increase the current drive in an MOS output transistor without increasing its area and without inducing signal overshoot.

It is a further object of the invention to substantially increase the current supplied by an MOS transistor operating at low voltage and using reasonable device area.

These and other objects are achieved by means of a coupling capacitor and logic means for controlling its charge and discharge. The output stage is gate driven by a tri-state inverter from a signal source. A coupling capacitor is connected between the output transistor gate and the output of a NOR gate. The NOR gate inputs are driven by the signal source and a delayed version of the signal source so that the capacitor is switched after a delay. In operation, the tri-state inverter drives the output transistor gate and the capacitor to charge both to substantially the input logic level. Then the tri-state inverter is turned off and the logic circuit switches the charged capacitor to $V_{DD}$ so that it then discharges into the gate, thereby driving it well in excess of the input logic level. The delays ensure that the capacitor charges and that no overshoot develops at the output stage.

BRIEF DESCRIPTION OF THE DRAWING

FIG. 1 is a logic diagram of the circuit of the invention;

FIG. 2 is a waveform diagram showing the logic signals at various points in the logic diagram of FIG. 1; and FIG. 3 is a schematic diagram of a circuit for performing the logic functions shown in FIG. 1.

DESCRIPTION OF THE INVENTION

Referring to FIG. 1, transistor 10 is an insulated gate field effect transistor (IGFET) of the MOS variety that is to be used to provide a substantial output current capability with respect to pad 11. Typically, the device connected to pad 11 is a digit in a conventional LED display (not shown). Since the digit includes the current in up to seven segments, it constitutes the highest current drain element in a given system. In order to make the system compatible with the lowest possible supply voltage (or battery), transistor 10 must be exploited at its maximum capability in order to keep its area as small as possible. With $V_{DD}$ kept as low as required by the power supply, the ordinary drive to transistor 10 would be insufficient to produce the desired conduction with reasonable device size. To produce the desired drive, the remainder of the circuit showing in FIG. 1 is incorporated into the same substrate that contains transistor 10. Basically two inverters, two delay elements, a NOR gate and a capacitor are added between input terminal 12 and the gate of transistor 10.

In the illustration of the invention to follow, it will be assumed that conventional p-channel MOS transistors are employed. This requires a negative $V_{DD}$ with respect to ground, and a negative going signal on the gate is required for turn on. For this kind of device transistor 10 becomes a sinking element for any load coupled to pad 11.

FIG. 2 shows the waveforms associated with various parts of FIG. 1. The upper waveform labeled 13 is the logic signal applied to input terminal 12 and would ordinarily represent the signal drive to the output stage. In the time interval A-D the negative going logic input would represent a one and would turn on the output stage. It can be seen that two inverters are imposed between input 12 and the gate of tansistor 10. Thus the logic input will turn the output stage on, but, as described above, not to the desired extent. Waveform 16 is the output from inverter 14 and it comprises the input to the first delay 17. It will be noted that in the following discussion, inverters 14 and 15 are shown as having no delay. While they both introduce delays, the timing is not critical to curcuit performance and can therefore be ignored. Waveform 18 represents the first delay 17 output, with time interval A-B representing the delay. Waveform 18 is applied to inverter 15 directly to produce Tri-State disconnect action. Thus, in the interval B-E when waveform 18 is in its logic zero state, inverter 15 will be turned off. In the interval A-B, both inverters 14 and 15 are active and the input logic one is transferred to the gate of transistor 10. This is represented as the initial fall of waveform 19, which is the gate signal on transistor 10. It will be noted that since the gate node of transistor 10 constitutes the highest circuit capacitance, substantial waveform rounding occurs.

Waveform 18 is also the input to the second delay 20, the output of which is waveform 21. This delay is shown as interval B-C. The interval A-C is the total circuit delay value. The time of the circuit delay is selected to be just long enough for waveform 19 to reach a significantly low level.

Waveforms 21 and 16 comprise the two inputs to NOR gate 22, the output of which is shown as waveform 23. As can be seen, the NOR gate 22 output is at logic zero when either input 16 or input 21 are at logic one. Thus the output of NOR gate 22 will be at logic one or high in the interval C-D. Since by the time C the input node capacitance (the gate capacitance of transistor 10 and that of capacitor 24) was pre-charged almost to a logic one as shown in waveform 19, when the NOR gate 22 output (waveform 23) goes to low to logic one waveform 19 is bootstrapped to a level substantially greater than logic one. Thus, in the time interval C-D, output transistor 10 will be turned on hard to a level well above the conventional power supply capability. Thus the area of the transistor is used to maximum effect.

It can be seen that the combined values of the first delay 17 and second delay 20 must be adequate to permit the capacitance at the gate node of transistor 10 to become almost fully charged. The second delay 20 can have a relatively short interval that is just long enough to make sure that the output of inverter 15 is fully floating as a tri-state device by the time NOR gate 22 turns on. This is important because if inverter 15 were not turned off, it would tend to clamp the output potential and prevent the bootstrap action.

FIG. 3 shows in schematic form a circuit that performs the functions of the logic diagram of FIG. 1. In the dashed outlines the related FIG. 1 functions are accomplished. Transistors 30, 33, 36, 39, 44, 45 and 47 are depletion mode and, except for transistor 33, all act as resistor elements. All other transistors are enhancement mode devices.

Transistors 30 and 31 comprise inverter 14. Transistors 32 and 33 comprise inverter 15. It can be seen that when the input to transistor 32 is a zero, and waveform 18 drives transistor 33 to a logic zero, the output of inverter 15 is full floating in the tri-state mode, thus leaving the gate node of transistor 10 floating. The gate of transistor 10 can then be boosted or bootstrapped in potential without any adverse action from inverter 15.

Transistors 34-37 and 39-40 are connected into a conventional one bit two phase dynamic shift register to provide the first delay 17 action. Capacitor 41 discharges during phase 2 when input 12 is at logic one. Then during phase 1, capacitor 42 charges, thereby turning transistor 40 on to drive the output of delay 17 to logic zero after the interval A-B. This interval is the time of one bit of dynamic delay.

Transistors 43-46 form a double inverter, the propagation delay of which provides adequate time for the second delay 20. This is the time interval B-C.

Transistors 47-49 comprise NOR gate 22. Here it can be seen that when either input is low or logic one, the output will be high or logic zero. However, when both inputs are high, as in the interval C-D, transistor 47 will pull the output low to logic one.

Transistor 50 completes the output stage and sorces output terminal 11. Since this requirement is nominal, transistor 11 can be of nominal size.

Transistor 51 is present because first delay 17 is of the dynamic variety. So long as the output of inverter 14 is at logic one, transistor 51 will pull the gate of transistor 33 to logic zero. This action allows transistor 32 to pull the gate of transistor 10 to logic zero starting at time D without any interference from transistor 33.

The following chart lists the critical part values in FIG. 3. The numbers characterizing the transistors are width/length values in mils. The higher the ratio, the greater the conduction for an on device.

| DEVICE | CHARACTERISTIC |
| --- | --- |
| Transistor 10 | 122/.3 |
| Capacitor 24 | 23 picofarads |
| Transistor 30 | .3/4 |
| Transistor 31 | .6/.3 |
| Transistor 32 | 2/.3 |
| Transistor 33 | .5/.3 |
| Transistor 34 | .3/.3 |
| Transistor 35 | .8/.3 |
| Transistor 36 | .3/1.5 |

-continued

| DEVICE | CHARACTERISTIC |
| --- | --- |
| Transistor 37 | .3/.3 |
| Transistor 38 | .3/.3 |
| Transistor 39 | .3/2 |
| Transistor 40 | .5/.3 |
| Capacitors 41 and 42 | 0.2 picofarad |
| Transistor 43 | .4/.3 |
| Transistor 44 | .3/2 |
| Transistor 45 | .3/2 |
| Transistor 46 | .4/.3 |
| Transistor 47 | .5/1 |
| Transistor 48 | .3/.3 |
| Transistor 49 | 2/.3 |
| Transistor 50 | 3.1/.3 |
| Transistor 51 | .4/.3 |

The invention has been described and a specific design example has been given. However, the invention should not be so limited because numerous alternatives and equivalents will occur to a person skilled in the art. Accordingly, it is intended that the invention be limited only the following claims.

We claim:

1. An output stage MOS transistor driver circuit comprising:
   tri-state inverter means coupled between a source of input signal and the gate electrode of said output stage transistor, said tri-state inverter having a control electrode for rendering the inverter floating upon application of a logic zero signal condition thereto:
   first delay means coupled between said source of input signal and said control electrode whereby said tri-state inverter couples said input signal from said source to said gate during the interval of said first delay;
   a NOR gate having a pair of input terminals and an output terminal, one input terminal being coupled to said source of input signals; a capacitor coupled between said gate electrode and said NOR gate output electrode; and
   second delay means coupled between said control electrode and the other input terminal of said NOR gate, whereby said capacitor is charged during said first delay interval and discharges into said gate electrode after said second delay interval to increase the signal drive on said gate electrode.

2. The circuit of claim 1 wherein said first delay is long enough to permit said capacitor to charge to a voltage that represents a major fraction of said drive signal.

3. The circuit of claim 2 wherein said second delay is made greater than the delay inherent in said tri-state inverter.

4. The circuit of claim 3 wherein said first delay means comprise one bit of a two phase clocked bit shift register.

5. The circuit of claim 4 wherein said second delay means comprise a pair of cascaded static inverter delay stages.

* * * * *